(12) United States Patent
Ko et al.

(10) Patent No.: US 12,495,621 B2
(45) Date of Patent: Dec. 9, 2025

(54) THIN FILM PHOTOVOLTAIC STRUCTURE AND MANUFACTURING METHOD THEREOF

(71) Applicant: WAYS TECHNICAL CORP., LTD., Taoyuan (TW)

(72) Inventors: Chung-Wen Ko, Taoyuan (TW); Yu-Fan Chang, Taoyuan (TW); Yu-Yang Chang, Taoyuan (TW); Sung-Chien Huang, Taoyuan (TW); Hsiou-Ming Liu, Taoyuan (TW)

(73) Assignee: WAYS TECHNICAL CORP., LTD., Taoyuan (TW)

( * ) Notice: Subject to any disclaimer, the term of this patent is extended or adjusted under 35 U.S.C. 154(b) by 0 days.

(21) Appl. No.: 18/225,332

(22) Filed: Jul. 24, 2023

(65) Prior Publication Data

US 2024/0047593 A1   Feb. 8, 2024

(30) Foreign Application Priority Data

Aug. 5, 2022   (TW) .................................. 111129519

(51) Int. Cl.
*H10F 19/33*   (2025.01)
*H10F 19/90*   (2025.01)

(52) U.S. Cl.
CPC ........... *H10F 19/33* (2025.01); *H10F 19/904* (2025.01)

(58) Field of Classification Search
None
See application file for complete search history.

(56) References Cited

U.S. PATENT DOCUMENTS 5,131,954 A * 7/1992 Vogeli .................. H10F 77/707
257/E27.125
2019/0109250 A1   4/2019 Li et al.
2019/0214510 A1   7/2019 Bredel et al.

FOREIGN PATENT DOCUMENTS

CN   110600579 A   12/2019
TW   200945601 A   11/2009
(Continued)

OTHER PUBLICATIONS

Office Action with the first search report for the corresponding TW Appln. 111129519 issued at Mar. 31, 2023.

*Primary Examiner* — Ryan S Cannon
(74) *Attorney, Agent, or Firm* — MUNCY, GEISSLER, OLDS & LOWE, P.C.

(57) ABSTRACT

A thin film photovoltaic structure has a substrate, a first conductive layer, a photovoltaic layer, a second conductive layer, multiple serial connection conductive layers and multiple first insulating areas. By using the serial connection conductive layer, each width between each adjacent serially connected photovoltaic structures is reduced, and an effective area of the thin film photovoltaic structure for collecting optic energy is increased, thus enhancing a geometry fill factor of the thin film photovoltaic structure. Further, by using the serial connection conductive layer and the first insulating area to form contact overlap areas in an overlapping arrangement, it can effectively protect conductive areas in the first conductive layer when etching the second conductive layer during the manufacturing process, which prevents the conductive areas from being damaged to not act as electrodes, and efficiently increases a manufacture yielding rate of the thin film photovoltaic structure.

6 Claims, 10 Drawing Sheets

(56) References Cited

FOREIGN PATENT DOCUMENTS

| TW | 200952187 A | 12/2009 |
|----|-------------|---------|
| TW | 201119058 A | 6/2011 |
| TW | 201630202 A | 8/2016 |
| TW | M565882 U | 8/2018 |
| TW | 201904080 A | 1/2019 |

* cited by examiner

THIN FILM PHOTOVOLTAIC STRUCTURE AND MANUFACTURING METHOD THEREOF

TECHNICAL FIELD

The present disclosure relates a photovoltaic structure and a manufacturing method of the photovoltaic structure, and particularly to a photovoltaic structure and a manufacturing method of the photovoltaic structure, both of which can increase an effective area for collecting optic energy, increase a geometry fill factor and enhance photovoltaic conversion efficiency.

RELATED ART

Among the existing green energy technologies, solar cells (i.e., photovoltaic cells) have been widely used. The solar cells can be divided into two types, one is inorganic solar cells and other one is organic solar cells. At present, conventional inorganic solar cells, such as Si, CdTe, and CIGS, still have the highest market share in the market. Although the service life and battery efficiency of the organic solar cells cannot be compared with inorganic solar cells, organic solar cells still have high design freedom and adaptability, such as, unique color, shape and transparency selection, etc. When it is used, it can be integrated into the building, and combined with the architectural curtain wall to make it more creative and varied.

However, to prepare a large-area organic solar cell module (also called thin film photovoltaic structure), it is necessary to use an etch manner to allow the upper and lower conductive layers to form a single independent battery unit (also called a sub-photovoltaic structure), and then to use a serially connection manner to connect each single battery unit in series, or use a parallel connection manner to connect a plurality of battery units in parallel to meet the specifications used. In practice, these processes of etching the upper and lower conductive layers often cause doubts about electric leakage between the upper and lower conductive layers due to the difficulty in matching the etching equipment and process conditions. For example, the thin film photovoltaic structure disclosed in Taiwan Patent No. M565882 (hereinafter referred to as "Document 1") is prone to over-etching when making the etching region of the upper conductive layer and destroys the lower conductive layer, which makes the thin film photovoltaic structure have a problem of poor charge conduction, thus resulting a poor manufacture yielding rate. It is noted that, the contents of Document 1 herein are incorporated in the present disclosure.

On the other hand, in order to promote the overall photovoltaic conversion efficiency of thin film photovoltaic structure, invalid areas (or be called inactive areas) in thin film photovoltaic structure must be reduced as far as possible, so as to increase an effective area of the thin film photovoltaic structure for collecting optic energy. The thin film photovoltaic structure and manufacturing method for increasing the geometric fill factor (GFF) have been disclosed in China Patent No. CN110600579A (hereinafter referred to as "Document 2"). In Document 2, the upper conductive layer of the sub-photovoltaic structure and the lower conductive layer of another sub-photovoltaic structure be adjacent to the sub-photovoltaic structure are electrically connected to each other by a conductive strip, so as to form two sub-photovoltaic structures being serially connected to each other. However, since the left and right sides of the conductive strip need to be covered with insulating areas to avoid short circuits, this increases the width of the ineffective area, so it cannot effectively improve the geometric fill factor. Moreover, in Document 2, the insulating areas are also covered with the conductive strip, and the upper conductive layer partially covers the conductive strip to form a contact, which instead increases the overall thickness of the thin film photovoltaic structure and is not conducive to thinning and lightening. It is noted that, the contents of Document 2 herein are incorporated in the present disclosure.

SUMMARY

To solve the technical problems of related art, one objective of the present disclosure is to provide a thin film photovoltaic structure and a manufacturing method of the thin film photovoltaic structure, so as to prevent a condition of over-etching, which damages a conductive layer, and the technical solution of the present disclosure can increase a manufacture yielding rate, efficiently increase a geometry fill factor and enhance photovoltaic conversion efficiency.

To achieve the above objective of the present disclosure, the present disclosure provides a thin film photovoltaic structure comprising: a substrate; a first conductive layer, disposed on the substrate, wherein the first conductive layer has multiple first etch areas and multiple first conductive areas, and the first conductive layer is divided into the first conductive areas by the first etch areas; a photovoltaic layer, disposed on the first conductive layer, wherein the photovoltaic layer has multiple photovoltaic etch areas and multiple photovoltaic areas, and the photovoltaic layer is divided into the photovoltaic areas by the photovoltaic etch areas; a second conductive layer, disposed on the photovoltaic layer, wherein the second conductive layer has multiple second etch areas and multiple second conductive areas, and the second conductive layer is divided into the second conductive areas by the second etch areas; multiple serial connection conductive layers, respectively disposed under the photovoltaic etch areas and respectively disposed on multiple upper surfaces of the first conductive areas, wherein the second conductive areas are respectively filled in the photovoltaic etch areas and respectively electrically connected to the serial connection conductive layers; and multiple first insulating areas, respectively disposed under the second etch areas and respectively disposed on multiple upper surfaces of the photovoltaic areas, wherein the first insulating areas are extended underneath to be respectively filled in the photovoltaic etch areas, the first insulating areas respectively contact the serial connection conductive layers to form multiple contact overlap areas, and the second etch areas are respectively disposed within multiple areas immediately above the contact overlap areas.

According to the above thin film photovoltaic structure, each of the second etch areas has a second etch area width, and each of the contact overlap areas has a contact overlap area width being larger than the corresponding second etch area width.

According to the above thin film photovoltaic structure, each of the serial connection conductive layers has a first serial connection conductive layer side edge on the upper surface of the corresponding the first conductive area, the first serial connection conductive layer side edge and a photovoltaic etch area side wall of the corresponding photovoltaic etch area have a first distance therebetween; each of the first insulating areas has a first insulating area side edge, the first insulating area side edge and the photovoltaic etch area side wall of the corresponding photovoltaic etch area have a second distance therebetween, which is larger than the corresponding first distance.

According to the above thin film photovoltaic structure, the thin film photovoltaic structure further comprises multiple second insulating areas, each of the second insulating areas is filled in all of the corresponding first etch area and in a part of the corresponding photovoltaic etch area, and each of the second insulating areas covers another photovoltaic etch area side wall of the corresponding photovoltaic etch area and extends to the upper surface of the other photovoltaic area which is adjacent to the photovoltaic etch area side wall of the corresponding photovoltaic etch area, and each of the first insulating areas covers the photovoltaic etch area side wall of the corresponding photovoltaic etch area.

According to the above thin film photovoltaic structure, each of the serial connection conductive layers has a serial connection conductive layer width which is larger than a photovoltaic etch area width of the corresponding photovoltaic etch area, and all of the photovoltaic etch areas respectively cover upper surfaces of the serial connection conductive layers.

According to the above thin film photovoltaic structure, each of the first insulating areas has an insulating area width which is larger than a second etch area width of the corresponding second etch area.

To achieve the above objective of the present disclosure, the present disclosure provides a manufacturing method of a thin film photovoltaic structure comprising steps of: disposing a first conductive layer on a substrate being transparent, and disposing multiple serial connection conductive layers on an upper surface of the first conductive layer at intervals; at multiple left sides of the serial connection conductive layers, etching down the first conductive layer to form multiple first etch areas; disposing a photovoltaic layer on the first conductive layer and on multiple upper surfaces of the serial connection conductive layers, wherein a part of the photovoltaic layer is extended to be filled in the first etch areas to contact the substrate; at locations on the serial connection conductive layers, etching the photovoltaic layer to form multiple photovoltaic etch areas and multiple photovoltaic areas; disposing multiple first insulating areas at locations of multiple surfaces of the photovoltaic areas, which are respectively adjacent to the photovoltaic etch areas, at intervals, wherein the first insulating areas are extended underneath to be respectively filled in the photovoltaic etch areas, and the first insulating areas respectively contact the serial connection conductive layers to form multiple contact overlap areas; and disposing a second conductive layer on the photovoltaic layer and on multiple upper surface of the first insulating areas to fill the second conductive layer in the photovoltaic etch areas to make the second conductive layer electrically connected to the serial connection conductive layers, and at locations immediately above the contact overlap areas, etching down the second conductive layer to form multiple second etch areas, wherein the second etch areas are respectively disposed within multiple areas immediately above the contact overlap areas, and a contact overlap area width of each contact overlap areas is larger than a second etch area width of the corresponding the second etch area.

According to the manufacturing method of the thin film photovoltaic structure, along multiple left side edges of the serial connection conductive layers, the first conductive layer is etched down to form the first etch areas.

To achieve the above objective of the present disclosure, the present disclosure provides a manufacturing method of a thin film photovoltaic structure comprising steps of: disposing a first conductive layer on a substrate being transparent, disposing multiple serial connection conductive layers on an upper surface of the first conductive layer at intervals, and then disposing a photovoltaic layer on both of the first conductive layer and the serial connection conductive layers; at multiple left sides of the serial connection conductive layers and on the upper surface of the photovoltaic layer, etching down the photovoltaic layer and the first conductive layer to form multiple first etch areas and multiple photovoltaic etch areas, and further etching the photovoltaic layer to expand the photovoltaic etch areas to make one of two photovoltaic etch area side walls of each of the photovoltaic etch areas be located on an upper surface location of the corresponding serial connection conductive layer, so as to form multiple photovoltaic areas; disposing each of multiple first insulating areas at a location on an upper surface of the corresponding photovoltaic area, which is adjacent to the one of the photovoltaic etch area side walls of the corresponding photovoltaic etch area, at intervals, wherein the first insulating areas are extended underneath to be respectively filled in the photovoltaic etch areas, and the first insulating areas respectively contact the serial connection conductive layers to form multiple contact overlap areas; disposing each of multiple second insulating areas in the corresponding first etch area at the other one of the corresponding photovoltaic etch area side walls, wherein each of the second insulating areas is filled in all of the corresponding first etch area and in a part of the corresponding photovoltaic etch area; and disposing a second conductive layer on the photovoltaic layer, on multiple upper surfaces of the first insulating areas and on multiple upper surfaces of the second insulating areas to make the second conductive layer electrically connected to the serial connection conductive layers, and at locations immediately above the contact overlap areas, etching down the second conductive layer to form multiple second etch areas, wherein the second etch areas are respectively disposed within multiple areas immediately above the contact overlap areas, and a contact overlap area width of each contact overlap areas is larger than a second etch area width of the corresponding the second etch area.

In the present disclosure, the high conductivity of the material of the serial connection conductive layers in the thin film photovoltaic structure is utilized, thus greatly shortening each of widths between two adjacent sub-photovoltaic structures when they are connected in series. Further, by setting the contact overlap area to make the inactive area in the thin film photovoltaic structure be three-dimensional, it can increase the effective area the thin film photovoltaic structure for collecting optic energy, effectively improve the geometric fill factor of the thin film photovoltaic structure, and then improve its photoelectric conversion efficiency. At the same time, through the arrangement of the multiple serial connection conductive layers, it is possible to avoid the condition of over-etching the first conductive areas below the serial connection conductive layers during the process of forming the photovoltaic etch areas, thereby ensuring that the thin-film photovoltaic cells will not generate leakage or short circuit. Moreover, through the setting of the contact overlap areas in an overlapping state by using the serial connection conductive layers and the first insulating areas, the first conductive areas can be effectively protected when the second conductive layer is etched during the production process, so as to prevent the first conductive areas from being damaged to not act as electrodes, and thus, it efficiently increases a manufacture yielding rate of the thin film photovoltaic structure. In addition, the setting of the second insulating areas can avoid leakage or short circuit between the serial connection conductive layers and the adjacent second conductive areas.

DETAILS OF EXEMPLARY EMBODIMENTS

The present disclosure relates a photovoltaic structure and a manufacturing method of the photovoltaic structure, and it can effectively improve the geometric fill factor of thin film photovoltaic structure through the setting of contact overlap areas, and can effectively protect the conductive areas when etching the conductive layer during the production process, so as to avoid the damage of the conductive areas and affect the functions as electrodes. Thus, the manufacture yielding rate of the thin film photovoltaic structure is enhanced. It is noted that, the etching manner or etching mentioned later in the present disclosure refers to any of wet etching, laser etching or mechanical scraping, and the present disclosure is not limited thereto.

Figure 1:
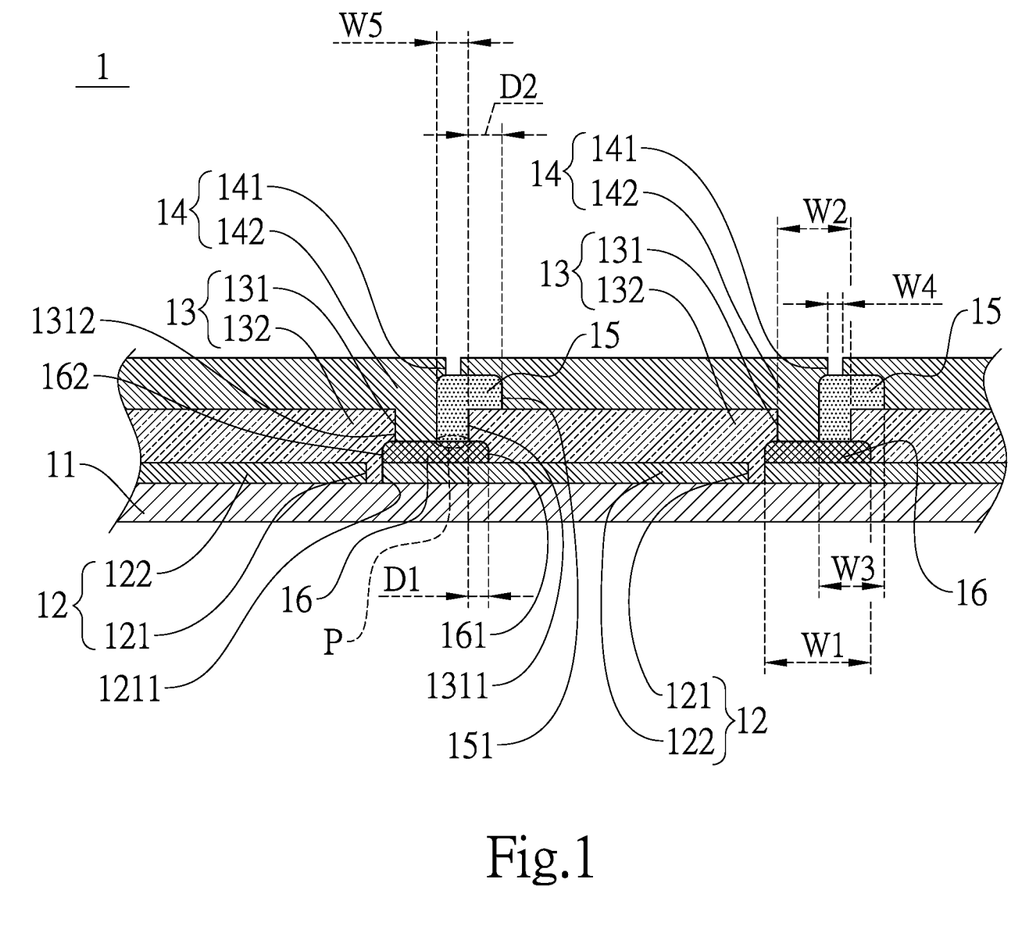
FIG. 1 is a schematic diagram showing a cross section of a thin film photovoltaic structure according to a first embodiment of the present disclosure.

Refer to FIG. 1, and FIG. 1 is a schematic diagram showing a cross section of a thin film photovoltaic structure according to a first embodiment of the present disclosure. The thin film photovoltaic structure 1 comprises a substrate 11, a first conductive layer 12, a photovoltaic layer 13, a second conductive layer 14, multiple first insulating areas 15 and multiple serial connection conductive layers 16.

The first conductive layer 12 is disposed on the substrate 11, wherein the first conductive layer 12 has multiple first etch areas 121 and multiple first conductive areas 122, and the first conductive layer 12 is divided into the first conductive areas 122 by the first etch areas 121. That is, each of the first etch areas 121 is disposed between the two corresponding adjacent first conductive areas 122. The photovoltaic layer 13 is disposed on the first conductive layer 12, wherein the photovoltaic layer 13 has multiple photovoltaic etch areas 131 and multiple photovoltaic areas 132, and the photovoltaic layer 13 is divided into the photovoltaic areas 132 by the photovoltaic etch areas 131. That is, each of the photovoltaic etch areas 131 is disposed between the two corresponding adjacent photovoltaic areas 132. A part of each of the photovoltaic area 132 is extended to be filled in the corresponding first etch area 121 to contact the substrate 11. The second conductive layer 14 is disposed on the photovoltaic layer 13, wherein the second conductive layer 14 has multiple second etch areas 141 and multiple second conductive area 142, and the second conductive layer 14 is divided into the second conductive areas 142 by the second etch areas 141. That is, the second etch area 141 is disposed between the two corresponding adjacent second conductive areas 142. The second conductive areas 142 are respectively filled in the photovoltaic etch areas 131 to be respectively electrically connected to the serial connection conductive layer 16. Each of the serial connection conductive layers 16 is disposed under the corresponding photovoltaic etch area 131 and merely disposed on a part of an upper surface of the corresponding first conductive area 122 of the first conductive layer 12. All of the photovoltaic etch areas 131 respectively cover upper surfaces of the serial connection conductive layers 16, and each of the serial connection conductive layers 16 has a serial connection conductive layer width W1 which is larger than a photovoltaic etch area width W2 of the corresponding photovoltaic etch area 131. The first insulating areas 15 are respectively disposed under the second etch areas 141 and respectively disposed on parts of multiple upper surfaces of the photovoltaic areas 132. All of the second etch areas 141 respectively cover upper surfaces of the first insulating areas 15. Each of the first insulating areas 15 is extended underneath to be filled in a part of the corresponding photovoltaic etch area 131, and covers one of two photovoltaic etch area side walls 1311, 1312 of the corresponding photovoltaic etch area 131, wherein in FIG. 1, each of the first insulating areas 15 covers the photovoltaic etch area side wall 1311 (i.e., right side wall in FIG. 1) of the corresponding photovoltaic etch area. Each of the first insulating areas 15 contact the corresponding serial connection conductive layer 16 to form a contact overlap area P. Each of the second etch area 141 is merely disposed within an area immediately above the corresponding contact overlap area P. Each of the first insulating areas 15 has an insulating area width W3 being larger than a second etch area width W4 of the corresponding second etch area 141. Each of the contact overlap areas P has a contact overlap area width W5 being larger than the second etch area width W4 of the corresponding second etch area 141.

Further in FIG. 1, each of the first conductive areas 122, the corresponding photovoltaic area 132 and the corresponding second conductive area 142 form a sub-photovoltaic structure, and thus the thin film photovoltaic structure 1 in fact comprises multiple sub-photovoltaic structures. The two adjacent sub-photovoltaic structures are connected in series by using the corresponding serial connection conductive layer 16, so as to increase a voltage provided. For example, there are three sub-photovoltaic structures are respectively located at the left side, middle part and right side in FIG. 1. The second conductive area 142 of the sub-photovoltaic structure located at the left side in FIG. 1 is deposited on the upper surface of the photovoltaic area 132 and the photovoltaic etch area 131, and is also deposited on and electrically connected to the upper surface of the serial connection conductive layer 16 on the upper surface of the first conductive area 122 of the sub-photovoltaic structure adjacent to the sub-photovoltaic structure at the left side (i.e., sub-photovoltaic structure located at the middle part in FIG. 1). Thus, the sub-photovoltaic structure located at the left side and the sub-photovoltaic structure located at the middle part can be connected to each other in series. Similarly, the sub-photovoltaic structure located at the middle part is also connected in series with the sub-photovoltaic structure located at the right side. By analogy, the thin film photovoltaic structure 1 can increase the overall voltage. In practice, multiple sub-photovoltaic structures can also be arranged in a manner of presenting surfaces, so that the surface of substrate 11 has m*n sub-photovoltaic structures, wherein m is the number of the horizontal sub-photovoltaic structures, n is the number of the vertical sub-photovoltaic structures, both m and n are integers greater than zero, and at least one of m or n is greater than or equal to 2.

Furthermore, each of the serial connection conductive layers 16 has a first serial connection conductive layer side edge 161 (i.e., right side edge in FIG. 1) formed on the upper surface of the corresponding first conductive area 122 of the first conductive layer 12. The first serial connection conductive layer side edge 161 and the photovoltaic etch area side wall 1311 (i.e., right wall in FIG. 1) of the photovoltaic etch area 131 covered with the first insulating area 15 have a first distance D1 therebetween. Each of the first insulating area 15 has a first insulating area side edge 151(i.e., right side edge in FIG. 1) formed on the upper surface of the corresponding photovoltaic area 132 of the photovoltaic layer 13. The first insulating area side edge 151 and the photovoltaic etch area side wall 1311 (i.e., right wall in FIG. 1) of the photovoltaic etch area 131 covered with the first insulating area 15 have a second distance D2 therebetween. The second distance D2 is larger than the first distance D1. The serial connection conductive layer 16 further has a second serial connection conductive layer side edge 162 (i.e., left side edge in FIG. 1) opposite to the first serial connection conductive layer side edge 161. The second serial connection conductive layer side edge 162 and the photovoltaic etch area side wall 1311 (i.e., right side wall in FIG. 1) of the photovoltaic etch area 131 and are not on the same line. The second serial connection conductive layer side edge 162 and the first etch area side wall 1211 (i.e., right side wall in FIG. 1) of the first etch area 121 are on the same line.

The thickness of the substrate 11 between 10 microns and 3000 microns. The material of the substrate 11 can be one of transparent plastic and glass. The layer thickness of the first conductive layer 12 is between 20 nanometers and 10 microns, and the width of the first etch area 121 is between 10 and 200 microns, preferably the width of the first etch area 121 is between 15 microns and 50 microns.

The photovoltaic layer 13 can be implemented by a conventional photovoltaic layer structure, and it comprises at least one electron transport layer, at least one hole transport layer, and at least one light-absorbing layer between at least one electron transport layer and at least one hole transport layer, wherein the above layers are not shown in the drawings of the present disclosure since they are known by person with the ordinary skill in the art. The thickness of the photovoltaic layer 13 is between 50 nanometers and 2 microns, preferably the thickness of the photovoltaic layer 13 is between 60 nanometers and 1 micron, and the photovoltaic layer 13 can be formed by one of coating, spraying, printing, sputtering, evaporation and immersion manner. The photovoltaic etch area width W2 is larger than 20 microns, preferably the photovoltaic etch area width W2 is larger than 50 microns.

The second conductive layer 14 has a thickness between 10 nanometers and 2000 nanometers, and it can be made of gold, silver, copper, aluminum or alloys thereof, or at least one of transparent conductive metal oxides, such as indium-tin oxide, indium-zinc oxide, indium gallium zinc oxide, aluminum-doped zinc oxide, etc. The second etch area width W4 of the second etch area 141 is between 20 microns and 500 microns, preferably the second etch area width W4 is between 50 microns and 100 microns.

The serial connection conductive layer width W1 of the serial connection conductive layer 16 is between 50 microns and 2500 microns, preferably the serial connection conductive layer width W1 is between 100 microns and 2000 microns. The serial connection conductive layer 16 is formed by printing, coating or spraying, and the serial connection conductive layer 16 is composed of one of silver glue, copper glue, carbon glue and graphite glue.

The insulating area width W3 of the first insulating area 15 is between 50 microns and 500 microns, preferably the insulating area width W3 is between 100 microns and 150 microns, and the first insulating area 15 is formed by printing, coating or spraying. The first insulating area 15 is formed by one of ultraviolet glue, epoxy resin, photosensitive polyimide resin, silicon oxide, silicon dioxide and silicon nitride.

In details, in the present disclosure, since the serial connection conductive layers 16 are respectively disposed under the photovoltaic etch areas 131, the formation is firstly to form the serial connection conductive layers 16 on specific locations on the first conductive areas 122, for example, by mesh-printing, then to form the photovoltaic layer 13 on both of the first conductive layer 12 and the serial connection conductive layers 16, and next to etch corresponding locations of the serial connection conductive layers 16 to form the photovoltaic etch areas 131. As shown in FIG. 1, since the serial connection conductive layer widths W1 of the serial connection conductive layers 16 are respectively larger than the photovoltaic etch area widths W2 of the photovoltaic etch areas 131, the etching depths of photovoltaic etch areas 131 will stop because of respectively contact with serial connection conductive layers 16 when the photovoltaic etch areas 131 are formed by wet etching, laser etching or mechanical scraping. In other words, through the arrangement of the serial connection conductive layers 16, it is possible to avoid over-etching the first conductive areas 122 under the serial connection conductive layers 16 during the process of forming the photovoltaic etch areas 131, so as to ensure that the thin-film photovoltaic cells will not generate leakage or short circuit.

Similarly, in the present disclosure, since the first insulating areas 15 are respectively disposed under the second etch areas 141, the formation is firstly to form the first insulating areas 15 on specific locations on the photovoltaic areas 132 for example, by mesh-printing, and to fill each of the first insulating areas 15 in a part of the corresponding photovoltaic etch area 131, so as to cover the photovoltaic etch area side wall 1311 (i.e., side wall in FIG. 1) of the photovoltaic etch area side walls 1311, 1312 of the corresponding photovoltaic etch area 131. Next, the formation is to form the second conductive layer 14 on the photovoltaic layer 13, and at each of areas immediately above the corresponding contact overlap area P which the corresponding contact overlap area 16 and the corresponding first insulating area 15 contact each other, the formation is then to etch the second conductive layer 14 to form the second etch areas 141. As shown in FIG. 1, since the second etch areas 141 are respectively located immediately above the contact overlap areas P, and the contact overlap area widths W5 of the contact overlap areas P are respectively larger than the second etch area widths W4, the etching depths of the second etch areas 141 will stop because of touching the first insulating areas 15 when the second etch areas 141 are formed by wet etching, laser etching or mechanical scraping, etc. In other words, it is possible to avoid over-etching of the serial connection conductive layers 16 under the first insulating areas 15 during the formation of the second etch areas 141 through the setting of the plural first insulating areas 15. In addition, through the setting of the contact overlap areas P, the situation of over-etching the first conductive areas 122 below the contact overlap area P during the process of forming the second etch areas 141 is avoided, thereby ensuring that the thin film photovoltaic cells do not generate leakage or short circuit.

Moreover, as mentioned above, the first serial connection conductive layer side edge 161 and the photovoltaic etch area side wall 1311 (i.e., right wall in FIG. 1) of the photovoltaic etch area 131 covered with the first insulating area 15 have the first distance D1 therebetween, and the first insulating area side edge 151 and the photovoltaic etch area side wall 1311 (i.e., right wall in FIG. 1) of the photovoltaic etch area 131 covered with the first insulating area 15 have the second distance D2 therebetween. Since the second distance D2 is larger than the first distance D1, it can effectively avoid leakage or short circuit between second conductive area 142 and serial connection conductive layer 16.

In the present disclosure, the serial connection conductive layers 16 are added on the first conductive layer 12 of the thin film photovoltaic structure, and thus the high conductivity of the material of the serial connection conductive layers 16 and the arrangement of the contact overlap areas P can be used to greatly shorten the widths between each two adjacent sub-photovoltaic structures connected in series, to make the ineffective area in the thin film photovoltaic structure be three-dimensional, to increase an effective area for collecting optic energy, and to increase the geometric fill factor of the thin film photovoltaic structure, thereby improving its photoelectric conversion efficiency. At the same time, the setting of the contact overlap areas P in the overlapping state formed by the serial connection conductive layers 16 and the first insulating areas 15 can effectively protect the first conductive areas 122 when the second conductive layer 14 is etched during the manufacturing process, so as to avoid the destruction of the first conductive areas 122 functioning as electrodes, thereby effectively improving the manufacture yielding rate of the thin film photovoltaic structure.

Figure 2:
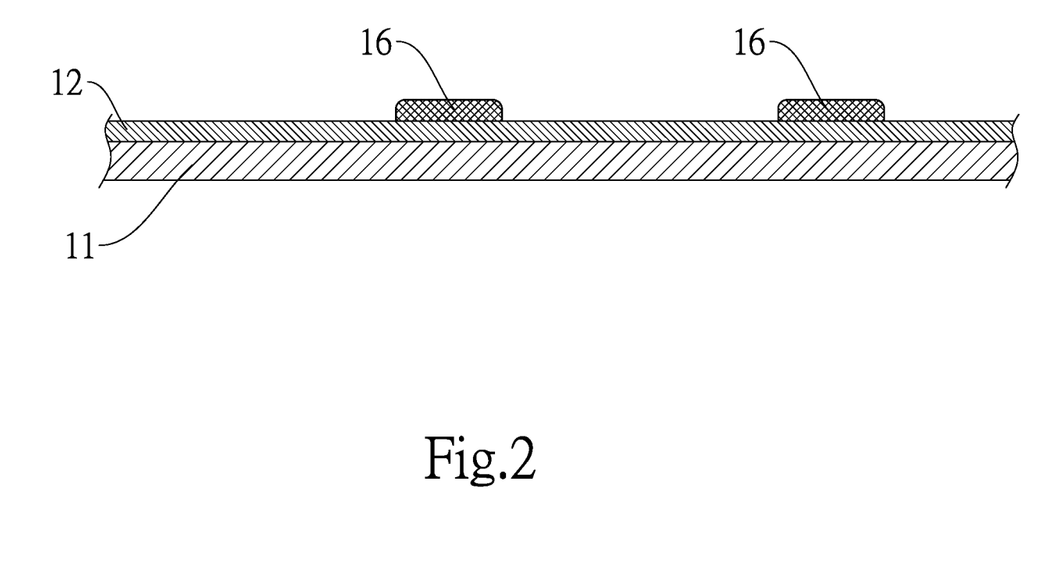
FIG. 2 is a first schematic diagram show a cross section of a mid-product during a manufacturing process of a manufacturing method of a thin film photovoltaic structure according to a first embodiment of the present disclosure.
Figure 3:
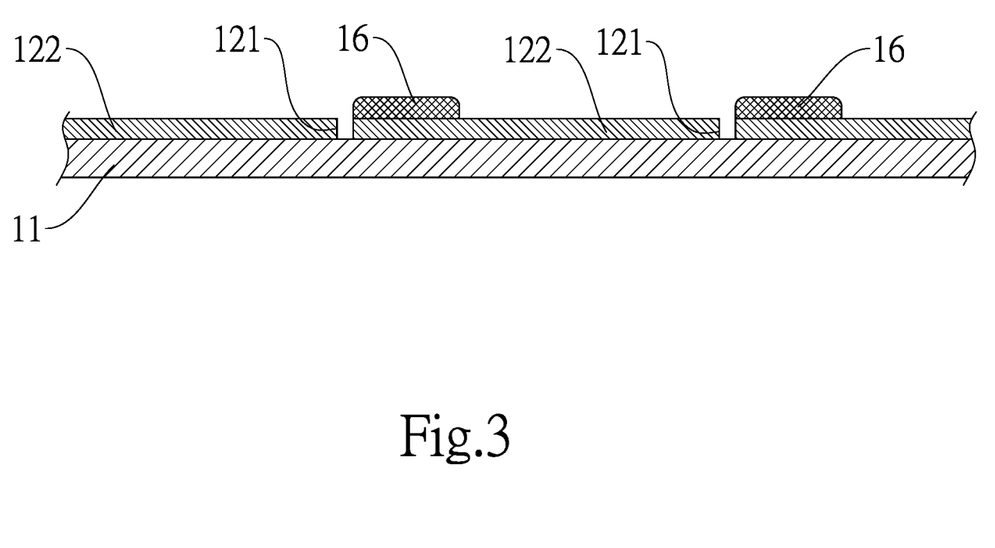
FIG. 3 is a second schematic diagram show a cross section of a mid-product during a manufacturing process of a manufacturing method of a thin film photovoltaic structure according to a first embodiment of the present disclosure.
Figure 4:
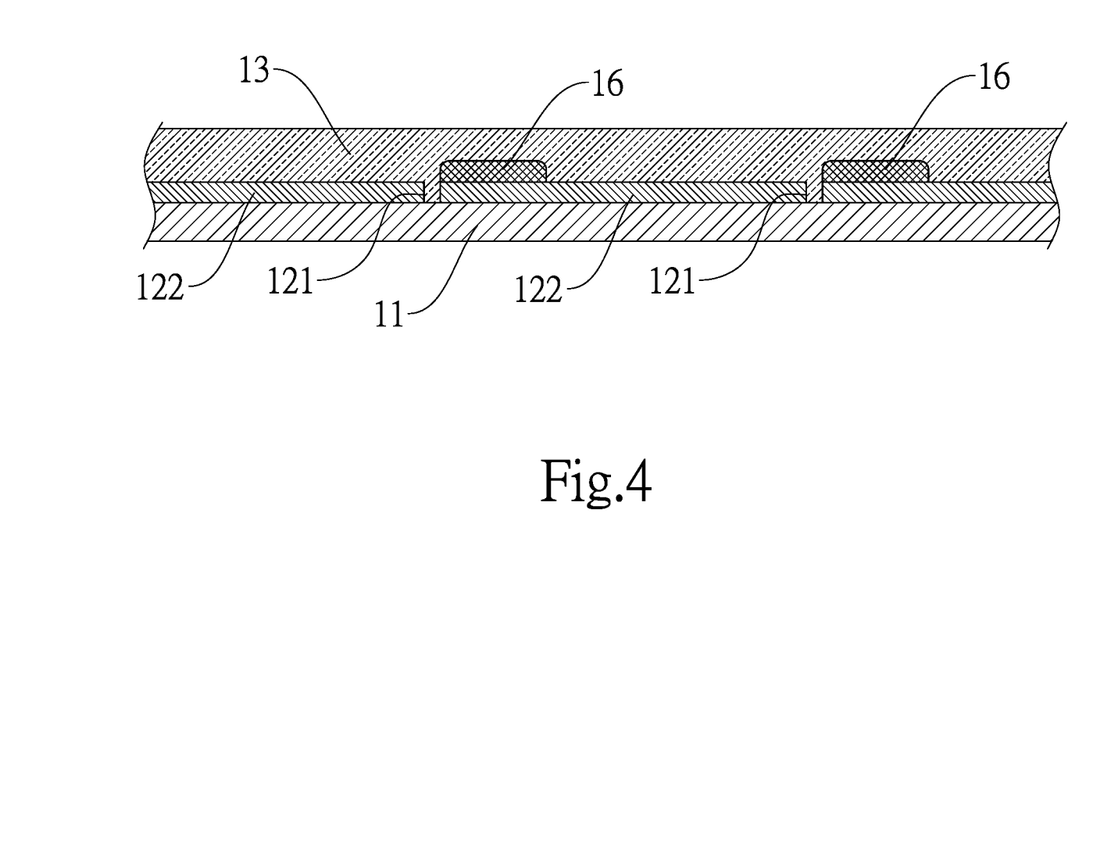
FIG. 4 is a third schematic diagram show a cross section of a mid-product during a manufacturing process of a manufacturing method of a thin film photovoltaic structure according to a first embodiment of the present disclosure.
Figure 5:
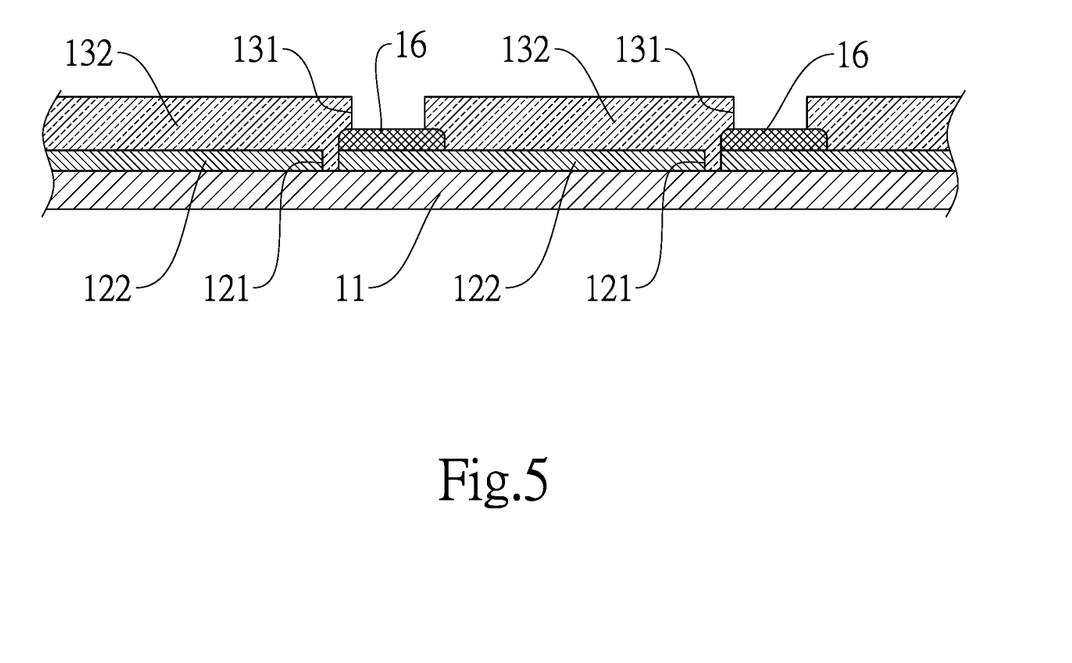
FIG. 5 is a fourth schematic diagram show a cross section of a mid-product during a manufacturing process of a manufacturing method of a thin film photovoltaic structure according to a first embodiment of the present disclosure.
Figure 6:
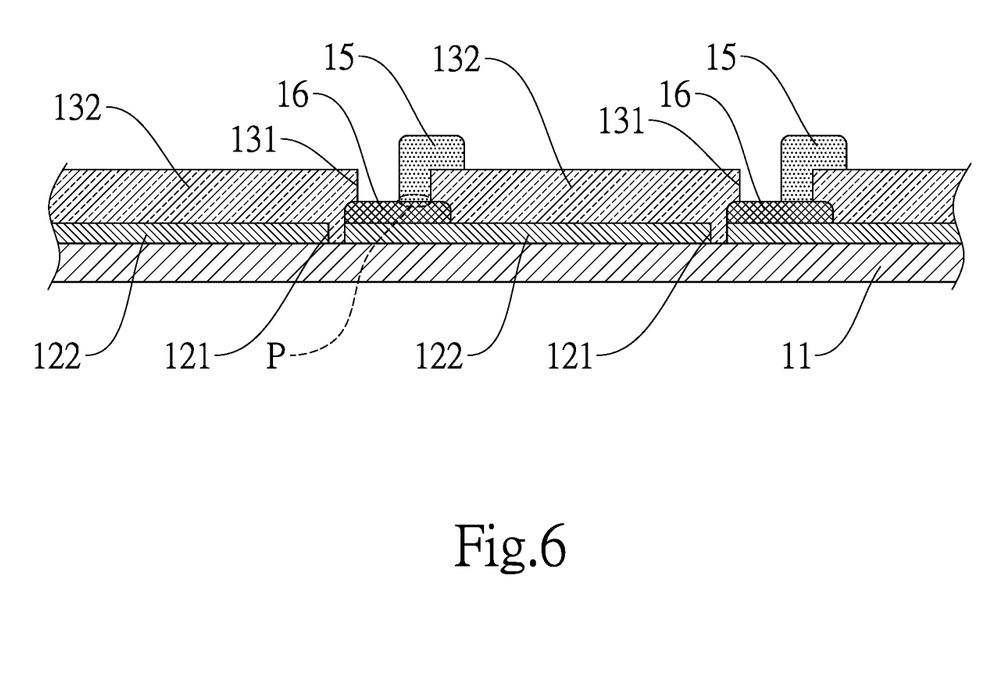
FIG. 6 is a fifth schematic diagram show a cross section of a mid-product during a manufacturing process of a manufacturing method of a thin film photovoltaic structure according to a first embodiment of the present disclosure.

According to the first embodiment shown in FIG. 2 to FIG. 6, the present disclosure further provides a manufacturing method of the thin film photovoltaic structure. Referring to FIG. 2 firstly, the first conductive layer 12 is disposed on the substrate 11 being transparent, such as by a deposition manner. Then, the serial connection conductive layers 16 are disposed on the upper surface of the first conductive layer 12 at intervals by mesh-printing. Next, referring to FIG. 3, at multiple left sides of the serial connection conductive layers 16, for example, at the left side edges of the serial connection conductive layers 16 (i.e., the above second serial connection conductive layer side edges 162), the first conductive layer 12 is etched down to form the first etch areas 121 and the first conductive areas 122. Next, referring to FIG. 4, the photovoltaic layer 13 is disposed on the first conductive layer 12 (for example, the upper surfaces of the first conductive areas 122) and on the upper surfaces of the serial connection conductive layers 16, wherein a part of the photovoltaic layer 13 is extended to be filled in the first etch areas 121 to contact the substrate 11. Next, referring to FIG. 5, at locations on the serial connection conductive layers 16, the photovoltaic layer 13 is etched to form the photovoltaic etch areas 131 and the photovoltaic areas 132. Then, referring to FIG. 6, the first insulating areas 15 are disposed at locations of multiple surfaces of the photovoltaic areas 132, which are respectively adjacent to the photovoltaic etch area side wall 1311 (i.e., right side wall in FIG. 6) of the photovoltaic etch area side walls 1311, 1312 of the photovoltaic etch areas 131, at intervals, by mesh-printing, wherein each of the first insulating areas 15 is extended underneath to be merely filled in the corresponding photovoltaic etch area 131 and to cover the photovoltaic etch area side wall 1311 (i.e., right side wall in FIG. 6) of the photovoltaic etch area side walls 1311, 1312 of the corresponding photovoltaic etch areas 131, and each of the first insulating areas 15 contacts the corresponding serial connection conductive layer 16 to form the contact overlap area P. Finally, referring to FIG. 1 again, the second conductive layer 14 is disposed on the photovoltaic layer 13 (for example, the upper surface of the photovoltaic layer 13) and on the upper surface of the first insulating areas 15 to fill the second conductive layer 14 in the photovoltaic etch areas 131 to make the second conductive layer 14 electrically connected to the serial connection conductive layers 16. Then, at locations immediately above the contact overlap areas P, the second conductive layer 14 is etched down to form the second etch areas 141. Each of the second etch areas 141 is merely disposed within the area immediately above the corresponding contact overlap area P, and the contact overlap area width W5 of each contact overlap areas P is larger than the second etch area width W4 of the corresponding second etch area 141.

Figure 7:
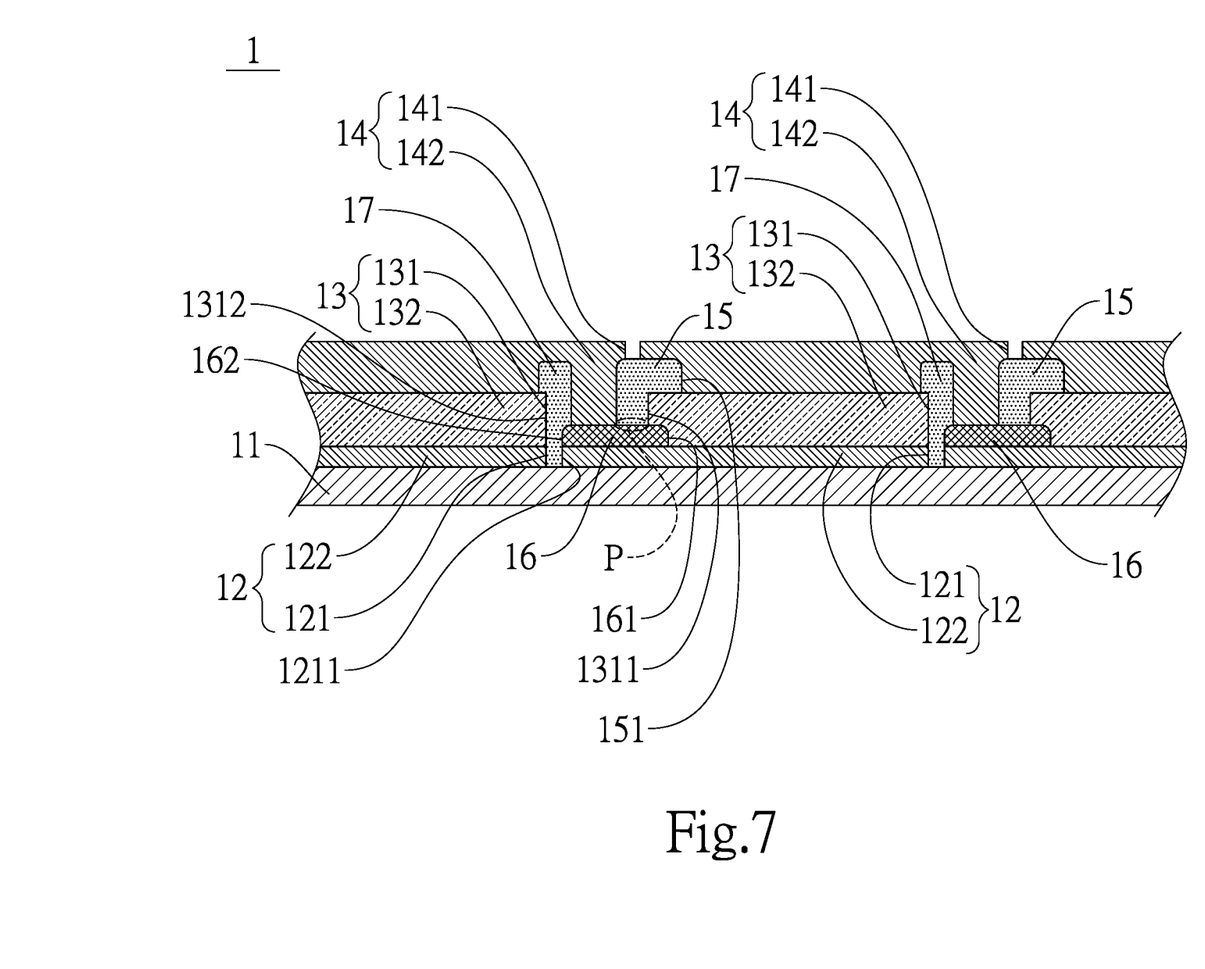
FIG. 7 is a schematic diagram showing a cross section of a thin film photovoltaic structure according to a second embodiment of the present disclosure.

Referring to FIG. 7, FIG. 7 shows a second embodiment of the present disclosure, the parts of the second embodiment similar to those of the first embodiment are omitted, and one of the differences between the first embodiment and the second embodiment is that the photovoltaic areas 132 are not filled in the first etch areas 121 and do not contact the substrate 11. In addition, in the second embodiment, the thin film photovoltaic structure 1 further comprises multiple second insulating areas 17, and each of the insulating areas 17 disposed on the side of the corresponding photovoltaic etch area 131, which is opposite to the corresponding first insulating area 15. Each of the second insulating areas 17 is filled in all of the corresponding first etch area 121 and in a part of the corresponding photovoltaic etch area 131, for example, by mesh-printing, and partially extends to cover and contact the upper surface of the corresponding photovoltaic area 132 of the adjacent sub-photovoltaic structure. For example, regarding the sub-photovoltaic structure in the middle part of FIG. 2, the first insulating area 15 is located at the right side of the corresponding photovoltaic etch area 131, and the second insulating area 17 is filled in the first etch area 121 and the left side of the photovoltaic etch area 131 and partially extends to cover and contact the upper surface of the corresponding photovoltaic area 132 of the adjacent sub-photovoltaic structure in the left side of FIG. 2. In addition, the second conductive area 142 covers the upper part of the corresponding second insulating area 17. In other words, each of the first insulating areas 15 covers the corresponding photovoltaic etch area side wall 1311, the thin film photovoltaic structure 1 further comprises multiple second insulating areas 17, and each of the second insulating areas 17 is filled in all of the corresponding first etch area 121 and in part of the corresponding photovoltaic etch area 131. Each of the second insulating areas 17 covers another photovoltaic etch area side wall 1312 of the corresponding photovoltaic etch area 131 and extends to the upper surface of the photovoltaic area 132 of the other one photovoltaic area 132 adjacent to the other one photovoltaic etch area side wall 1312. Therefore, the setting of the second insulating area 17 can avoid leakage or short circuit between the corresponding serial connection conductive layer 16 and the corresponding adjacent second conductive area 142. For example, regarding the serial connection conductive layer 16 of the sub-photovoltaic structure in the middle part of FIG. 2, since the second insulating area 17 is filled in the first etch area 121, even if the increase in geometry fill factor causes the distance of the second conductive areas 142 in the sub-photovoltaic structure to be close, it can avoid leakage or short circuit.

Figure 8:
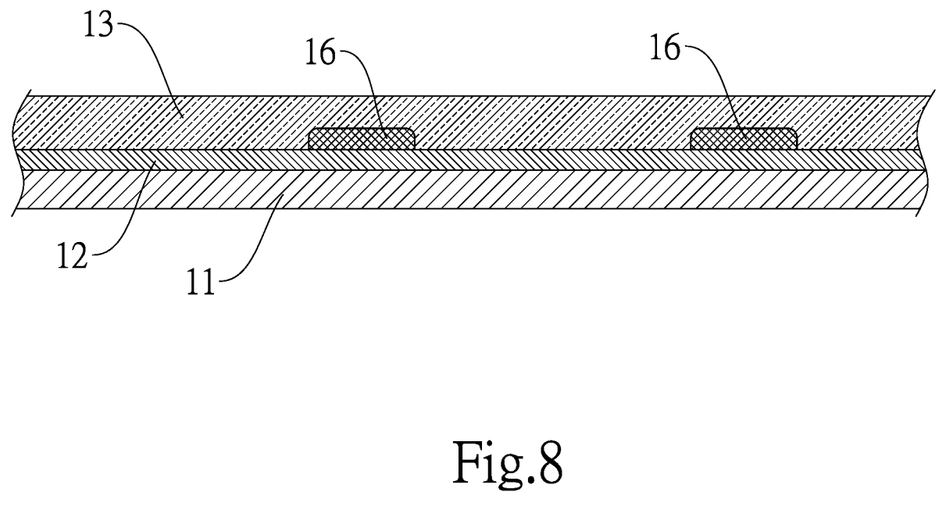
FIG. 8 is a first schematic diagram show a cross section of a mid-product during a manufacturing process of a manufacturing method of a thin film photovoltaic structure according to a second embodiment of the present disclosure.
Figure 9:
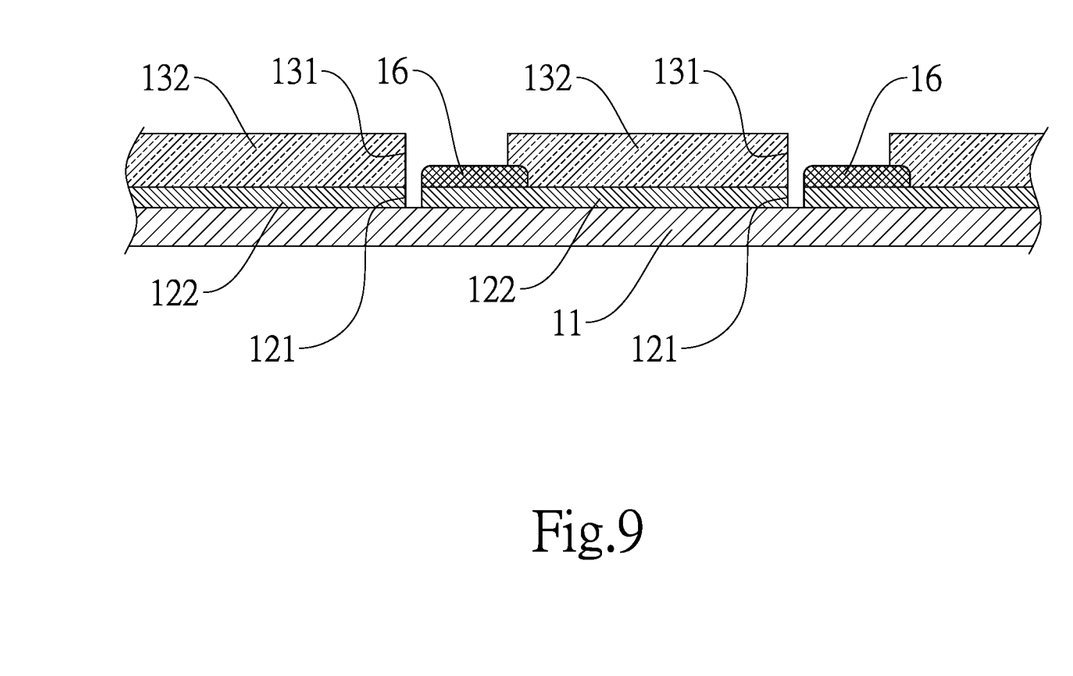
FIG. 9 is a second schematic diagram show a cross section of a mid-product during a manufacturing process of a manufacturing method of a thin film photovoltaic structure according to a second embodiment of the present disclosure.
Figure 10:
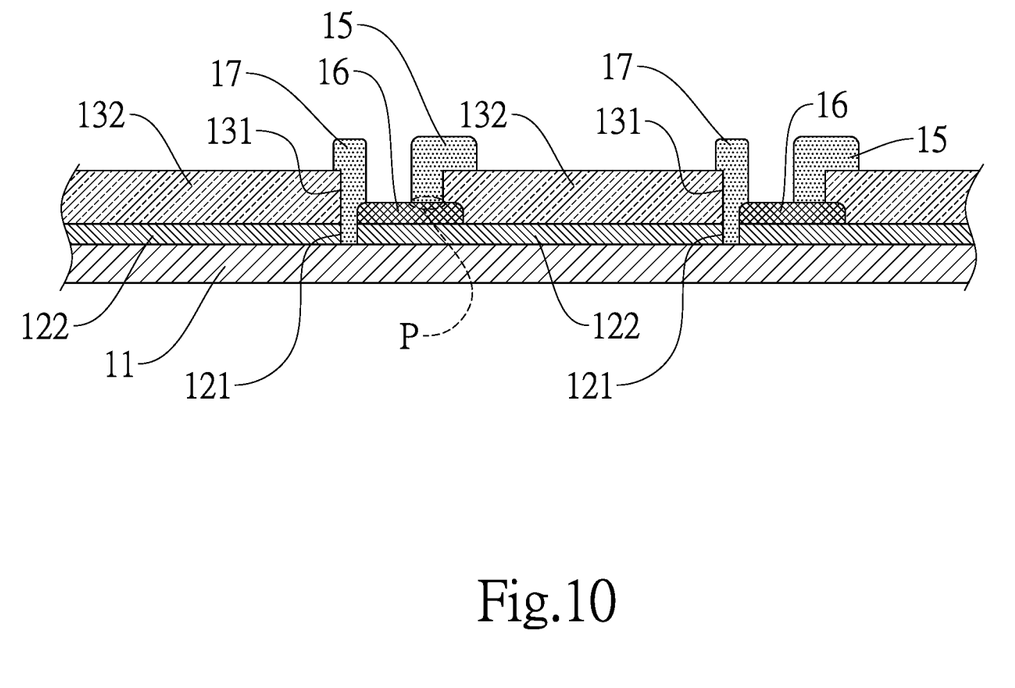
FIG. 10 is a third schematic diagram show a cross section of a mid-product during a manufacturing process of a manufacturing method of a thin film photovoltaic structure according to a second embodiment of the present disclosure.

According to the second embodiment of the present disclosure, the present disclosure further provides a manufacturing method of another one thin film photovoltaic structure as shown in FIG. 8 to FIG. 10. Referring to FIG. 8 firstly, the first conductive layer 12 is disposed on the substrate 11 being transparent, such as by a deposition manner. Then, the serial connection conductive layers 16 are disposed on the upper surface of the first conductive layer 12 at intervals by mesh-printing. Next, the photovoltaic layer 13 is disposed on both of the first conductive layer 12 and the serial connection conductive layers 16. Then, referring to FIG. 9, at multiple left sides of the serial connection conductive layers 16, for example, at the left side edges of the serial connection conductive layers 16 (i.e., the above second serial connection conductive layer side edges 162), the first conductive layer 12 and the photovoltaic layer 13 are etched down to form the first etch areas 121 and another photovoltaic etch area side wall 1312 (i.e., left side wall in FIG. 9) of the photovoltaic etch area side wall 1311, 1312 of each of the photovoltaic etch areas 131. Next, the photovoltaic layer 13 is further etched to expand to make the photovoltaic etch area side wall 1311 (i.e., right side wall in FIG. 9) of the photovoltaic etch area side walls 1311, 1312 of each of the photovoltaic etch areas 131 be located on an upper surface location of the corresponding serial connection conductive layer 16. Next, referring to FIG. 10, each of the first insulating areas 15 is disposed at a location on an upper surface of the corresponding photovoltaic area 132, which is adjacent to the photovoltaic etch area side wall 1311 (i.e., right side wall in FIG. 10) of the photovoltaic etch area side walls 1311, 1312 of the corresponding photovoltaic etch area 131, at intervals, by mesh-printing. Each of the first insulating areas 15 is extended underneath to be merely filled in the photovoltaic etch area side wall 1311 (i.e., right side wall in FIG. 10) of the photovoltaic etch area side walls 1311, 1312 of the corresponding photovoltaic etch area 131, and the first insulating areas 15 respectively contact the serial connection conductive layers 16 to form the contact overlap areas P. Next, each of the second insulating areas 17 is disposed in the other photovoltaic etch area side wall 1312 (i.e., left side wall in FIG. 10) of the photovoltaic etch area side walls 1311, 1312 of the corresponding photovoltaic etch area and in the corresponding first etch area 121. Each of the second insulating areas 17 is filled in all of the corresponding first etch area 121 and in a part of the corresponding photovoltaic etch area 131, partially extends to cover and contact the upper surface of the corresponding photovoltaic area 132 of the adjacent sub-photovoltaic structure. Next, referring to FIG. 7 again, the second conductive layer 14 is disposed on the photovoltaic layer 13 (for example, the upper surface of the photovoltaic layer 13), on the upper surface of the first insulating areas 15 and on the upper surfaces of the second insulating areas 17 by using the deposition manner, and the second conductive layer 14 is filled in the photovoltaic etch areas 131 to contact the serial connection conductive layers 16. Then, at locations immediately above the contact overlap areas P, the second conductive layer 14 is etched down to form the second etch areas 141. Each of the second etch areas 141 is merely disposed within the area immediately above the corresponding contact overlap area P, and the contact overlap area width W5 of each contact overlap areas P is larger than the second etch area width W4 of the corresponding second etch area 141.

To sum up, regarding the thin film photovoltaic structure of the present disclosure, the high conductivity of the material of the serial connection conductive layers is utilized, thus greatly shortening each of widths between two adjacent sub-photovoltaic structures when they are connected in series. Further, by setting the contact overlap area P to make the inactive area in the thin film photovoltaic structure be three-dimensional, it can increase the effective area the thin film photovoltaic structure for collecting optic energy, effectively improve the geometric fill factor of the thin film photovoltaic structure, and then improve its photoelectric conversion efficiency. At the same time, through the arrangement of the multiple serial connection conductive layers 16, it is possible to avoid the condition of over-etching the first conductive areas 122 below the serial connection conductive layers 16 during the process of forming the photovoltaic etch areas 131, thereby ensuring that the thin-film photovoltaic cells will not generate leakage or short circuit. Through the setting of the contact overlap areas P in an overlapping state by using the serial connection conductive layers 16 and the first insulating areas 15, the first conductive areas 122 can be effectively protected when the second conductive layer 12 is etched during the production process, so as to prevent the first conductive areas 122 from being damaged to not act as electrodes, and thus, it efficiently increases a manufacture yielding rate of the thin film photovoltaic structure. In addition, the setting of the second insulating areas 17 can avoid leakage or short circuit between the serial connection conductive layers 16 and the adjacent second conductive areas 142.

Although exemplary embodiments of the present disclosure have been described in detail for purposes of illustration, various modifications and enhancements may be made without departing from the spirit and scope of the present disclosure. Accordingly, the present disclosure is not to be limited except as by the appended claims.

What is claimed is:
1. A thin film photovoltaic structure, comprising:
   a substrate;
   a first conductive layer, disposed on the substrate, wherein the first conductive layer has multiple first etch areas and multiple first conductive areas, and the first conductive layer is divided into the first conductive areas by the first etch areas;

a photovoltaic layer, disposed on the first conductive layer, wherein the photovoltaic layer has multiple photovoltaic etch areas and multiple photovoltaic areas, and the photovoltaic layer is divided into the photovoltaic areas by the photovoltaic etch areas;

a second conductive layer, disposed on the photovoltaic layer, wherein the second conductive layer has multiple second etch areas and multiple second conductive areas, and the second conductive layer is divided into the second conductive areas by the second etch areas;

multiple serial connection conductive layers, respectively disposed under the photovoltaic etch areas and respectively disposed on multiple upper surfaces of the first conductive areas, wherein the second conductive areas are respectively filled in the photovoltaic etch areas and respectively electrically connected to the serial connection conductive layers; and multiple first insulating areas, respectively disposed under the second etch areas and respectively disposed on multiple upper surfaces of the photovoltaic areas, wherein the first insulating areas are extended underneath to be respectively filled in the photovoltaic etch areas, the first insulating areas respectively contact the serial connection conductive layers to form multiple contact overlap areas, and the second etch areas are respectively disposed within multiple areas immediately above the contact overlap areas;

wherein each of the second etch areas has a second etch area width, and each of the contact overlap areas has a contact overlap area width being larger than the corresponding second etch area width.

2. The thin film photovoltaic structure of claim 1, wherein each of the serial connection conductive layers has a first serial connection conductive layer side edge on the upper surface of the corresponding first conductive area, the first serial connection conductive layer side edge and a photovoltaic etch area side wall of the corresponding photovoltaic etch area have a first distance therebetween; each of the first insulating areas has a first insulating area side edge, the first insulating area side edge and the photovoltaic etch area side wall of the corresponding photovoltaic etch area have a second distance therebetween, which is larger than the corresponding first distance.

3. The thin film photovoltaic structure of claim 2, wherein the thin film photovoltaic structure further comprises multiple second insulating areas, each of the second insulating areas is filled in all of the corresponding first etch area and in a part of the corresponding photovoltaic etch area, and each of the second insulating areas covers another photovoltaic etch area side wall of the corresponding photovoltaic etch area and extends to the upper surface of the other photovoltaic area which is adjacent to the photovoltaic etch area side wall of the corresponding photovoltaic etch area, and each of the first insulating areas covers the photovoltaic etch area side wall of the corresponding photovoltaic etch area.

4. The thin film photovoltaic structure of claim 2, wherein each of the serial connection conductive layers has a serial connection conductive layer width which is larger than a photovoltaic etch area width of the corresponding photovoltaic etch area, and all of the photovoltaic etch areas respectively cover upper surfaces of the serial connection conductive layers.

5. The thin film photovoltaic structure of claim 3, wherein each of the first insulating areas has an insulating area width which is larger than a second etch area width of the corresponding second etch area.

6. The thin film photovoltaic structure of claim 4, wherein each of the first insulating areas has an insulating area width which is larger than a second etch area width of the corresponding second etch area.

* * * * *